(12) United States Patent
Uetani et al.

(10) Patent No.: US 6,495,306 B2
(45) Date of Patent: Dec. 17, 2002

(54) CHEMICALLY AMPLIFIED POSITIVE RESIST COMPOSITION

(75) Inventors: Yasunori Uetani, Toyonaka (JP); Hiroaki Fujishima, Toyonaka (JP); Yoshiyuki Takata, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 76 days.

(21) Appl. No.: 09/741,438

(22) Filed: Dec. 21, 2000

(65) Prior Publication Data

US 2001/0014428 A1 Aug. 16, 2001

(30) Foreign Application Priority Data

Dec. 22, 1999 (JP) ............................................. 11-364726

(51) Int. Cl.[7] ................................................ G03F 7/039
(52) U.S. Cl. ..................................... 430/270.1; 430/910
(58) Field of Search ............................... 430/270.1, 910

(56) References Cited

U.S. PATENT DOCUMENTS 6,303,266 B1 * 10/2001 Okino et al. ............. 430/270.1

FOREIGN PATENT DOCUMENTS

| EP | 0999474 A1 | 5/2000 |
|----|------------|--------|
| JP | 2000122295 | 7/2000 |

* cited by examiner

Primary Examiner—John S. Chu
(74) Attorney, Agent, or Firm—Birch Stewart Kolasch & Birch LLP

(57) ABSTRACT

A chemically amplified positive resist composition which is suitable for use in an exposure process utilizing an ArF excimer laser and is capable of forming a resist coat exhibiting a high hydrophillcity; is excellent in adhesion to a substrate and satisfactory in resist performance characteristics; and comprises a resin (X) which has a polymeric unit(a) derived from dihydroxy-1-adamantyl (meth)acrylate and a polymeric unit(b) derived from 2-alkyl-2-adamantyl (meth) acrylate, and which, per se, is insoluble or slightly soluble in alkali but becomes soluble in alkali due to an action of acid; and an acid generating agent (Y).

4 Claims, No Drawings

CHEMICALLY AMPLIFIED POSITIVE RESIST COMPOSITION

BACKGROUND OF THE INVENTION

The present invention relates to a chemical amplifying type positive resist composition used in the minute processing of a semiconductor.

In general, a lithography process using a resist composition has been adopted in the minute processing of a semiconductor. In lithography, the resolution can be improved with a decrease in wavelength of exposure light in principle as expressed by the equation of Rayleigh's diffraction limited. A g-line with a wavelength of 436 nm. an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source.

A lens used in an ArF excimer laser exposure machine or an exposure machine using a light-source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No.. 3, pages 387–398 (1996) by D. C. Hofer, are heretofore known as such resins. However, conventionally known resins have a problem that peeling of f of a pattern tends to occur due to insufficient adhesion at development especially when the polarity is insufficient.

Journal of Photopolymer Science and Technology, Vol. 9, No. 3, pages 475–487 (1996) by S. Takechi et al., and JP-A-9-73173 reported that when a polymer or copolymer of 2-methyl-2-adamantyl methacrylate is used as a resin of a chemical amplifying type, 2-methyl-2-adamantyl is cleaved by the action of an acid to act as a positive type, and high dry etching resistance and high resolution as well as good adhesion to a substrate can be attained.

Generally, a resin having an alicyclic ring exhibits a high hydrophobicity and hence does not have a favorable affinity with a developer, which is an aqueous alkali. When the affinity with such a developer is unsatisfactory, uniform development cannot be achieved with the result that the dimensional uniformity of a resulting pattern is affected or a defective development occurs.

An object of the present invention is to provide a chemically amplified positive resist composition containing a resin component and an acid generating agent which is suitable for use in excimer laser lithography utilizing ArF, KrF or the like, and is satisfactory in various resist performance characteristics such as sensitivity, resolution, and adhesion to a substrate while exhibiting an excellent affinity (wettability) with respect to an alkali developer.

JP-A-10-274852 has reported that the use of a resin having a butyrolactone residue in part of a polymeric unit thereof for a chemically amplified positive resist composition improves the adherence of the resist composition to a substrate. Also, JP-A-11-305444 has reported that the use of a resin having polymeric units derived from 2-alkyl-2-adamantyl (meth)acrylate and from maleic anhydride, respectively, for a chemically amplified resist composition improves the adherence of the resist composition to a substrate.

The inventors of the present invention have discovered the fact that the adhesion of a chemically amplified positive resist composition to a substrate is improved also by the use of a polymer having a polymeric unit derived from 2-alkyl-2-adamantyl (meth)acrylate and a polymeric unit derived from 3-hydroxy-1-adamantyl (meth)acrylate as a resin in the resist composition, and have filed Japanese Patent Application No. 11-238542. The inventors have further discovered the fact that the use of a resin including a polymeric unit derived from hydroxystyrene and a polymeric unit derived from 3-hydroxy-1-adamantyl methacrylate improves the resolution and exposure latitude of the resulting resist composition, and have filed Japanese Patent Application No.11-28895. As a result of further study based on these discoveries and knowledge, the inventors of the present invention has further discovered the fact that a resist composition is obtained which is superior in resist performance characteristics such as sensitivity, resolution and adhesion to a substrate while exhibiting an improved hydrophillicity, hence, an improved wettability with an alkali developer by using a resin containing a polymeric unit of high polarity having a specified adamantane structure in the resist composition. The present invention has been completed based on this discovery.

SUMMARY OF THE INVENTION

The present invention provides a chemically amplified positive resist composition comprising a resin (X) which has a polymeric unit (a) derived from dihydroxy-1-adamantyl (meth)acrylate and a polymeric unit (b) derived from 2-alkyl-2-adamantyl (meth) acrylate, and which, per se, is insoluble or slightly soluble in alkali but becomes soluble in alkali due to an action of acid; and an acid generating agent (Y).

DETAILED DESCRIPTION OF THE PREFERRED EMBODIMENTS

The resin (X), per se, is insoluble or slightly soluble in alkali but becomes soluble in alkali when subjected to an action of acid. The resin (X) contains a polymeric unit(a) derived from dihydroxy-1-adamantyl (meth)acrylate and a polymeric unit(b) derived from 2-alkyl-2-adamantyl (meth) acrylate. The polymeric unit(a) derived from dihydroxy-1-adamantyl (meth)acrylate is represented by the following formula (I):

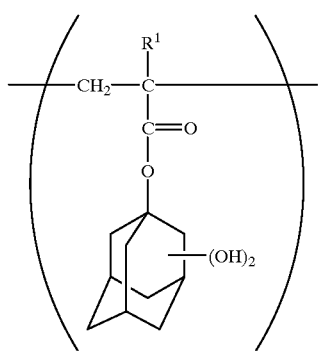

(I)

where $R^1$ represents hydrogen or methyl. Representative examples of this polymeric unit include a polymeric unit derived from 3,5-dihydroxy-1-adamantyl (meth)acrylate represented by the following formula (Ia):

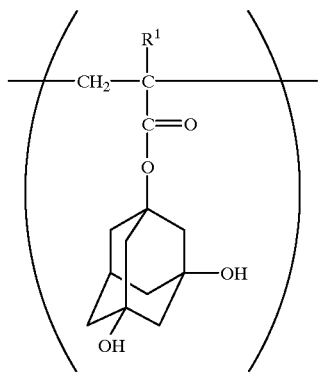

(Ia)

wherein $R^1$ is as defined above.

3,5-Dihydroxy-1-adamantyl (meth)acrylate, from which the polymeric unit of the formula (Ia) is derived, is commercially available but may be prepared by hydrolyzing 1,3,5-tribromoadamantane into 1,3,5-trihydroxyamadantane which is then reacting with acrylic acid, methacrylic acid, or their halide.

The resin (X) has the polymeric unit(b) derived from 2-alkyl-2-adamantyl (meth)acrylate along with the polymeric unit(a) derived from dihydroxy-1-adamantyl (meth) acrylate. In general, resins for use in chemically amplified positive resists are, per se, insoluble or slightly soluble in alkali but become soluble in alkali after a group forming part of such a resin has been cleaved due to an action of acid. In the present invention, the group which is cleavable due to an action of acid is 2-alkyl-2-adamantyl, and the polymeric unit(b) derived from 2-alkyl-2-adamantyl (meth)acrylate is a polymeric unit having an acid unstable group.

The polymeric unit derived from 2-alkyl-2-adamantyl (meth)acrylate can be represented by the following formula (II):

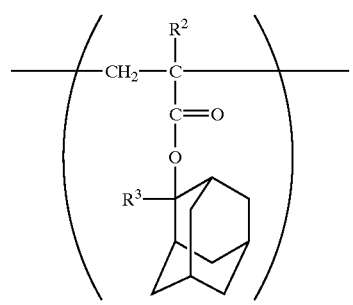

(II)

wherein $R^2$ represents hydrogen or methyl, and $R^3$ represents an alkyl.

Since 2-alkyl-2-adamantyl in the polymeric unit of the formula (II) derived from 2-alkyl-2-adamantyl (meth) acrylate is cleavable due to an action of acid, this unit contributes to an enhancement in the solubility in alkali of a film of the resist having undergone exposure, and the resist containing a resin having this unit together with an acid generating agent functions as a positive resist. Further, by virtue of the presence of an adamantane ring, an alicyclic ring, derived from 2-alkyl-2-adamantyl (meth)acrylate, the polymeric unit provides the resulting resist with a high transmittance with respect to ArF excimer laser light, a high contrast and a superior resolution, and contributes to an improvement in dry etching resistance.

In the formula (II), $R^3$ is an alkyl which can have, for example, about 1 to 6 carbon atoms and which is advantageously a straight chain in general but may be a branched chain when the number of carbon atoms is 3 or more. Examples of $R^3$ include methyl, ethyl. n-propyl, isopropyl and n-butyl.

2-Alkyl-2-adamantyl (meth)acrylate, from which the polymeric unit(b) of the formula (II) is derived, is usually prepared by reacting 2-alkyl-2-adamantanol or a metal salt thereof with an acrylic acid halide or a methacrylic acid halide.

The resin(X) having the polymeric unit (a) derived from dihydroxy-1-adamantyl (meth)acrylate and the polymeric unit (b) derived from 2-alkyl-2-adamantyl (meth)acrylate may contain an additional polymeric unit as desired. Examples of polymeric units which are suitable for coexistence with the units (a) and (b) include one derived from (meth)acryloyloxy-γ-butyrolactone of which lactone ring may be optionally substituted with an alkyl, and one derived from maleic anhydride. The polymer unit derived from (meth)acryloyloxy-γ-butyrolactone of which lactone ring may be optionally substituted with an alkyl can be represented by the following formula (III). The polymer unit derived from maleic anhydride can be represented by the following formula (IV).

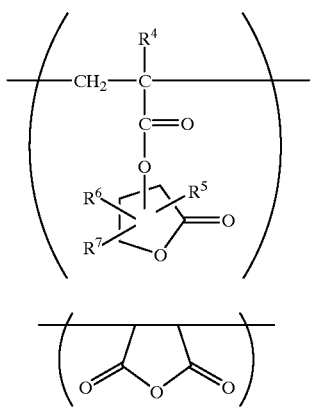

wherein $R^4$ represents hydrogen or methyl, and $R^5$, $R^6$ and $R^7$ represent, independently each other, hydrogen or an alkyl. When $R^5$, $R^6$ and $R^7$ are each an alkyl, the alkyl can have about 1 to 6 carbon atoms and may be a straight or branched chain when the number of its carbon atoms is 3 or more. Examples of specific alkyls represented by $R^5$, $R^6$ or $R^7$ include methyl, ethyl, propyl and butyl.

The resin having the polymeric unit (a) derived from dihydroxy-1-adamantyl (meth)acrylate, the polymeric unit (b) derived from 2-alkyl-2-adamantyl (meth)acrylate and the polymeric unit derived from any other monomer, for example. (meth)acryloyloxy-γ-butyrolactone of which lactone ring may be substituted with an alkyl, or maleic anhydride as above, may be prepared by copolymerization of these monomers. Usually, this reaction is achieved by dissolving the monomers in a solvent and allowing the reaction of the monomers to proceed in the presence of a polymerization initiator such as an azo compound. Example of the azo compound include azobisisobutyronitrile or dimethyl 2,2'-azobis( 2-methylpropionate). As required, a polymerization regulator such an organic sulfur compound may be added. Examples of the organic sulfur compound include 2-ethylhexyl 3-mercaptopropionic acid or 3-methoxybutyl 3-mercaptopropionic acid.

Alternatively, it is possible to introduce a dihydroxy-1-adamantyl group or a 2-alkyl-2-adamantyl group in the resin by polymerizing a (meth)acrylic acid or a (meth)acrylic acid ester with any other monomer, if required, and then subjecting the resulting polymer to a known reaction for introducing a protective group.

The resin (X) preferably contains the polymeric unit (a) derived from dihydroxy-1-adamantyl (meth)acrylate in an amount ranging from about 4 to about 70 mol % based on the total units of the resin. Where an aromatic unit is not substantially contained, the amount of the unit(a) derived from dihydroxy-1-adamantyl (meth)acrylate is preferably from about 20 to about 70 mol % based on the total units of the resin.

The unit(b) derived from 2-alkyl-2-adamantyl (meth) acrylate is preferably contained in an amount ranging from about 30 to about 80 mol % based on the total units of the resin.

The acid generator which is another component is decomposed to generate an acid by irradiating the component itself or a resist composition including the component With radioactive rays such as light and an electron beam. The acid generated from the acid generator acts on the resin to cleave the group which is to be cleaved by the action of an acid present in the resin. Examples of such acid generators include onium salt compounds, organic halogen compounds, sulfone compounds, and sulfonate compounds. Specifically, the following compounds can be mentioned:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate.
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluorornethane-sulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethane-sulfonate,
4-tert-butylphenyldiphenylsulfonium trifluoromethane-sulfonate,
4-phenylthiophenyldiphenylsulfonium hexafluoro-phosphate,
4-phenylthiophenyldiphenylsulfonium hexafluoroanti-monate,
1-(2-naphthoylmethyl)thiolanium hexafluoroantimonate,
1-(2-naphthoylmethyl)thiolanium trifluoromethane-sulfonate,
4-hydroxy-1-naphthyldimethylsulfonium hexafluoroanti-monate,
4-hydroxy-1-naphthyldimethylsulfonium trifluoromethane-sulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone,
bis(phenylsulfonyl)diazomethane, bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

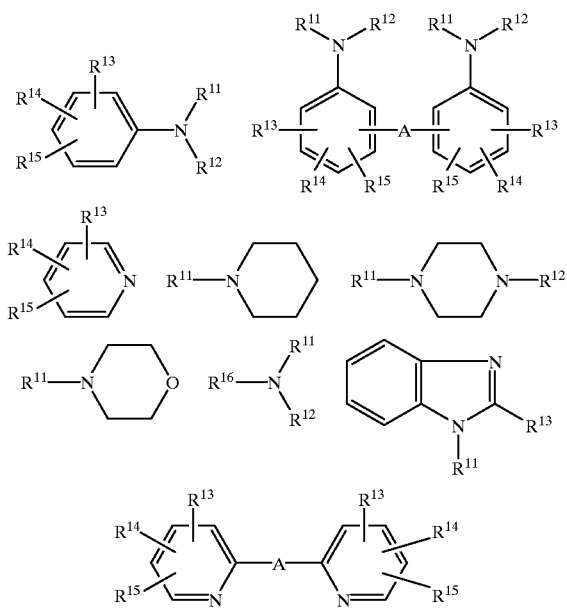

wherein $R^{11}$ and $R^{12}$ represent, independently each other, hydrogen, cycloalkyl, aryl or alkyl which may be optionally substituted with a hydroxyl; $R^{13}$, $R^{14}$ and $R^{15}$, which are same or different from each other, represent hydrogen. cycloalkyl, aryl, alkoxy or alkyl which may be optionally substituted with a hydroxyl; $R^{16}$ represents cycloalkyl or alkyl which may be optionally substituted with a hydroxyl; A represents alkylene, carbonyl or imino. The alkyl represented by $R^{11}$ to $R^{16}$ and alkoxy represented by $R^{13}$ to $R^{15}$ may have about 1 to 6 carbon atoms. The cycloalkyl may have about 5 to 10 carbon atoms and the aryl may have about 6 to 10 carbon atoms. The aryl represented by $R^{11}$ to $R^{15}$ may have about 6 to 10 carbon atoms. The alkylene represented by A may have about 1 to 6 carbon atoms and may be straight-chained or branched.

The resist composition of the present invention preferably contains the resin(X) in an amount in the range of 80 to 99.9% by weight, and the acid generating agent(Y) in an of 0.1 to 20% by weight based on the total amount of the resin(X) and the acid generating agent(Y). When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, resins other than resin(X), surfactants, stabilizers, and dyes so far as the objets of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqeous solution of tetramethylammoniumhydroxide or (2-hydroxyethyl)trimethylammoniumhydroxide (so-called colline) is often used.

Next, the present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

Monomer Synthesis 1 (Synthesis of 2-methyl-2-adamantyl methacrylate)

A vessel was charged with 83.1 g of 2-methyl-2-adamantanol and 101 g of triethylamine, and 200 g of methyl isobutyl ketone was added thereto to form a solution. To the solution was added dropwise 78.4 g of methacrylic acid chloride(1.5 times the molar amount of 2-methyl-2-adamantanol), followed by stirring for about 10 hours at room temperature. After filtration, the resulting organic layer was washed with an aqueous solution of 5 wt % sodium bicarbonate and then washed with water twice. The organic layer was concentrated and then distilled under reduced pressure to obtain 2-methyl-2-adamantyl methacrylate represented by the following formula.

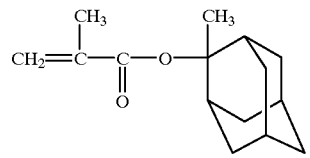

Monomer Synthesis 2 (Synthesis of 2-ethyl-2-adamantyl methacrylate)

To 31.1 g of 2-adamantanone was added 50 g of diethyl ether to form a solution. To the solution was added dropwise 200 ml of a solution of ethyllithium (at a concentration of 1.14 mol/L) in diethyl ether while keeping the solution at a temperature not higher than 10° C. After stirring for two hours at 0° C., methacrylic acid chloride in an amount of 26.2 g (1.2 times the molar amount of 2-adamantanone) was added dropwise to the solution while keeping the solution at a temperature not higher than 10° C. After the dropwise addition was completed, the resulting mixture was stirred for about 12 hours at room temperature. Thereafter, the precipitated organic salt was filtered off. The resulting organic layer was washed with anqueous solution of 5 wt % sodium bicarbonate and then washed with water twice. The organic layer was concentrated and then distilled under reduced pressure to obtain 2-ethyl-2-adamantyl methacrylate represented by the following formula.

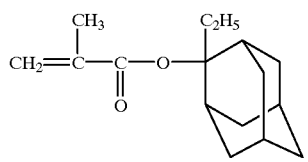

Monomer Synthesis 3 (Synthesis of α-methacryloyloxy-γ-butyrolactone)

A vessel was charged with 100 g of α-bromo-γ-butyrolactone and 104.4 g of methacrylic acid(2.0 times the molar amount of a-bromo-γ-butyrolactone). Then. methyl isobutyl ketone in a weight three times the weight of α-bromo-γ-butyrolactone was added thereto to form a solution. To the solution was added dropwise 183.6 g of triethylamine(3.0 times the molar amount of α-bromo-γ-butyrolactone), followed by stirring for about 10 hours at room temperature. After filtration, the resulting organic layer was washed with an aqueous solution of 5 wt % sodium bicarbonate and then washed with water twice. The organic layer was concentrated to obtain α-methacryloyloxy-γ-butyrolactone represented by the following formula.

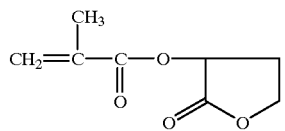

Resin Synthesis 1 (Synthesis of a 2-methyl-2-adamantyl methacrylate/3,5-dihydroxy-1-adamantyl methacrylate/α-methacryloyloxy-γ-butyrolactone copolymer)

2-Methyl-2-adamantyl methacrylate, 3,5-dihydroxy-1-adamantyl methacrylate and α-methacryloyloxy-γ-butyrolactone were mixed in a molar ratio of 2:1:1 (20.0 g:11.4 g:7.3 g). This mixture was further mixed with 1.12 g of 2-ethylhexyl 3-mercaptopropionic acid(0.12 times the molar amount of 3,5-dihydroxy-1-adamantyl methacrylate) as a polymerization regulator and 40 g of 1,4-dioxane to form a monomer solution. 10 g of Dioxane is added to 2,2'-azobisisobutyronitrile in an amount equivalent to 1 mol % of the total amount of all the monomers to form an initiator solution. These monomer solution and initiator solution were gradually poured parallel into 50 g of 1,4-dioxane heated to 70° C. over two hours, followed by stirring for 5 hours. After cooling, the reaction mass was mixed with a large quantity of heptane to cause a polymeric matter to precipitate, followed by filtration. Subsequently, the resulting wet cake was dissolved into 1,4-dioxane and mixed with a large quantity of heptane to cause a polymeric matter to precipitate, followed by filtration. The process from dissolution to reprecipitation was performed once again for purification to obtain a copolymer having a weight-average molecular weight of about 7,100 and a degree of dispersion (weight-average molecular weight/number-average molecular weight) of 1.6. The copolymer thus obtained referred to as resin A.

Resin Synthesis 2 (Synthesis of a 2-ethyl-2-adamantyl methacrylate/3,5-dihydroxy-1-adamantyl methacrylate/α-methacryloyloxy-γ-butyrolactone copolymer)

2-Ethyl-2-adamantyl methacrylate, 3,5-dihydroxy-1-adamantyl methacrylate and α-methacryloyloxy-γ-butyrolactone were mixed in a molar ratio of 2:1:1 (20.0 g:10.8 g:6.85 g). This mixture was further mixed with 1.06 g of 2-ethylhexyl 3-mercaptopropionic acid(0.12 times the molar amount of 3,5-dihydroxy-1-adamantyl methacrylate) as a polymerization regulator and 40 g of 1,4-dioxane to form a monomer solution. 10 g of Dioxane is added to 2,2'-azobisisobutyronitrile in an amount equivalent to 1 molt of the total amount of all the monomers to form an initiator solution. These monomer solution and initiator solution were gradually poured parallel into 50 g of 1,4-dioxane heated to 70° C. over two hours, followed by stirring for 5 hours. Thereafter, the same purification process as in Resin Synthesis 1 was repeated to obtain a copolymer having a weight-average molecular weight of about 5,600 and a degree of dispersion of 1.5. The copolymer thus obtained referred to as resin B.

Resin Synthesis 3 (Synthesis of a 2-methyl-2-adamantyl methacrylate/3-hydroxy-1-adamantyl methacrylate/α-methacryloyloxy-γ-butyrolactone copolymer)

2-methyl-2-adamantyl methacrylate, 3-hydroxy-1-adamantyl methacrylate and α-methacryloyloxy-γ-butyrolactone were mixed in a molar ratio of 2:1:1 (20.0 g:9.9 g:7.26 g). This mixture was further mixed with 40 g of methylisobutylketone to form a monomer solution. 10 g of methylisobutylketone is added to 2,2'-azobisisobutyronitrile in an amount equivalent to 1.2 mol % of the total amount of all the monomers to form an initiator solution. These monomer solution and initiator solution were gradually poured parallel into 50 g of methylisobutylketone heated to 85° C. over two hours, followed by stirring for 5 hours. After cooling, the reaction mass was mixed with a large quantity of heptane to cause a polymeric matter to precipitate, followed by filtration. Subsequently, the resulting wet cake was dissolved into methylisobutylketone and mixed with a large quantity of heptane to cause a polymeric matter to precipitate, followed by filtration. The process from dissolution to reprecipitation was performed once again for purification to obtain a copolymer having a weight-average molecular weight of about 11,000 and a degree of dispersion of 1.6. The copolymer thus obtained referred to as resin X.

Resin Synthesis 4 (Synthesis of a 2-ethyl-2-adamantyl methacrylate/3-hydroxy-1-adamantyl methacrylate/α-methacryloyloxy-γ-butyrolactone copolymer)

2-Ethyl-2-adamantyl methacrylate, 3-hydroxy-1-adamantyl methacrylate and α-methacryloyloxy-γ- butyrolactone were mixed in a molar ratio of 2:1:1 (20.0 g:9.5 g:6.85 g). This mixture was further mixed with 40 g of methylisobutylketone to form a monomer solution. 10 g of methylisobutylketone is added to 2,2'-azobisisobutyronitrile in an amount equivalent to 2 mol % of the total amount of all the monomers to form an initiator solution. These monomer solution and initiator solution were gradually poured parallel into 50 g of methylisobutylketone heated to 85° C. over two hours, followed by stirring for 5 hours. Thereafter, the same purification process as in Resin Synthesis 3 was repeated to obtain a copolymer having a weight-average molecular weight of about 11,200 and a degree of dispersion of 1.8. The copolymer thus obtained referred to as resin Y.

Resist compositions are prepared using the resins obtained above and the following acid generating agents.
Acid generating agent
C: p-tolyldiphenylsulfonium trifluoromethanesulfonate,
D: p-tolyldiphenylsulfonium perfluorooctanesulfonate,

EXAMPLES 1 AND 2 and

Comparative Examples 1 and 2

Components listed below were mixed and filtered through a fluorine resin filter having a pore diameter of 0.2 µm to give resist solutions.
Resin (listed in Table 1) 10 parts
Acid generating agent(listed in Table 1): 0.1 part
Quencher: dicyclohexylmethylamine 0.0075 part
Solvent: ethyl lactate 60 parts On a silicon wafer, a composition "DUV-42" manufactured by Brewer Co. Ltd. was applied and baked under conditions of 215° C. for 60 seconds so that an organic reflection-preventing membrane having a thickness of 1,600 angstrom was formed on the wafer. The resist solution obtained above was applied by spin-coating on said wafer so that the film thickness after drying was 0.39 µm. After applying the resist solution, the wafer was pre-baked on a direct hotplate at a temperature shown in Table 1. column "Pre-bake" for 60 seconds. Ultra pure water was applied on the pre-baked resist film and contact angle was measured by a contact angle measuring apparatus (Ermagoniometer type manufactured by Erma chemical Co., Ltd.) The results are shown in Table 1.

The wafer having a resist film formed thereon was irradiated with a ArF eximer stepper ["NSR-ArF", manufactured by Nikon, NA=0.55, σ=0.6] through a line-and-space pattern, changing stepwise the exposure amount. The exposed wafer was subjected to post-exposure baking (PEB) on a hot plate at 130° C. for 60 seconds. Then the wafer was subjected to paddle development with 2.38% by weight aqueous tetramethyl ammonium hydroxide solution for 60 seconds. The developed bright field pattern was observed by a scanning electron microscope and assessed for the effective sensitivity and the resolution by the following methods:

Effective sensitivity: This is expressed in the minimum amount of exposure which gave 1:1 line-and-space pattern of 0.18 µm.

Resolution: This is expressed in the minimum size which gave line-and-space pattern spitted at the exposure amount of the effective sensitivity.

A bright field pattern is obtained by exposure and development through a reticle comprising an outer frame formed of a chromium layer (lightproof layer) and linear chromium layers (lightproof layers) formed on a surface of a glass substrate (light-transmissive portion). Accordingly, after exposure and development, portions of the resist layer surrounding a line and space pattern is removed with a portion of the resist layer corresponding to the outer frame being left outside the line and space pattern.

TABLE 1

| | Resin | Acid generating agent | Pre-bake temperature | Contact angle | Effective sensitivity | Resolution |
|---|---|---|---|---|---|---|
| Example 1 | A | C(0.1 part) | 150° C. | 56° | 54 mJ/cm$^2$ | 0.16 µm |
| Example 2 | B | D(0.2 parts) | 130° C. | 55° | 30 mJ/cm$^2$ | 0.16 µm |
| Comparative Example 1 | X | C(0.1 part) | 150° C. | 60° | 66 mJ/cm$^2$ | 0.16 µm |
| Comparative Example 2 | Y | D(0.2 parts) | 130° C. | 59° | 30 mJ/cm$^2$ | 0.16 µm |

As seen from Table 1, when the resist containing the resin specified by the present invention was used in an ArF excimer laser exposure, the contact angle between the resist coat and water was decreased without degrading the sensitivity and resolution as compared with the comparative example. This means that the resist has an improved affinity with the developer and hence is effective in improving the line width uniformity and reducing the possibility of defective development.

The chemically amplified positive resist composition according to the present invention is suitable for use in an exposure process utilizing an ArF excimer laser or the like and is capable of forming a resist coat exhibiting a high hydrophilicity and hence decreasing the contact angle between the resist coat and water. Further, the resist composition is excellent in adhesion to a substrate and satisfactory in resist performance characteristics such as dry etching resistance, sensitivity and solution.

What is claimed is:

1. A chemically amplified positive resist composition comprising a resin (X) which has a polymeric unit(a) derived from dihydroxy-1-adamantyl (meth)acrylate and a polymeric unit(b) derived from 2-alkyl-2-adamantyl (meth)acrylate, and which, per se, is insoluble or slightly soluble in alkali but becomes soluble in alkali due to an action of acid; and an acid generating agent (Y).

2. The resist composition according to claim 1, wherein the polymeric unit(a) derived from dihydroxy-1-adamantyl (meth)acrylate is a unit derived from 3,5-dihydroxy-1-adamantyl (meth)acrylate.

3. The resist composition according to claim 1, wherein the resin (X) further has a polymeric unit derived from (meth)acryloyloxy-γ-butyrolactone of which lactone ring may be optionally substituted with an alkyl and/or a polymeric unit derived from maleic anhydride.

4. The resist composition according to claim 1, which further comprises an amine as a quencher.

* * * * *